(12) United States Patent
Cheng et al.

(10) Patent No.: US 12,310,203 B2
(45) Date of Patent: May 20, 2025

(54) DISPLAY SUBSTRATE WITH SPACERS ON CATHODE POWER LINE AND DISPLAY APPARATUS

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Leilei Cheng, Beijing (CN); Yongqian Li, Beijing (CN); Dacheng Zhang, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 572 days.

(21) Appl. No.: 17/626,434

(22) PCT Filed: Feb. 9, 2021

(86) PCT No.: PCT/CN2021/076205
§ 371 (c)(1),
(2) Date: Jan. 11, 2022

(87) PCT Pub. No.: WO2021/164645
PCT Pub. Date: Aug. 26, 2021

(65) Prior Publication Data
US 2022/0262890 A1 Aug. 18, 2022

(30) Foreign Application Priority Data
Feb. 19, 2020 (CN) .......................... 202010102481.2

(51) Int. Cl.
| | | |
|---|---|---|
| H01L 27/32 | (2006.01) | |
| H10K 59/122 | (2023.01) | |
| H10K 59/131 | (2023.01) | |

(52) U.S. Cl.
CPC ....... H10K 59/1315 (2023.02); H10K 59/122 (2023.02)

(58) Field of Classification Search
CPC .................................................. H10K 59/1315
See application file for complete search history.

(56) References Cited

U.S. PATENT DOCUMENTS

| | | | |
|---|---|---|---|
| 2005/0140279 A1 | 6/2005 | Park | |
| 2012/0135661 A1* | 5/2012 | Imanishi | ........... G02F 1/133723 |
| | | | 252/182.28 |

(Continued)

FOREIGN PATENT DOCUMENTS

| | | |
|---|---|---|
| CN | 103258968 A | 8/2013 |
| CN | 103296033 A | 9/2013 |

(Continued)

OTHER PUBLICATIONS

Office Action for Chinese Patent Application No. 202010102481.2 issued by the Chinese Patent Office on Jul. 19, 2022.

*Primary Examiner* — Peter Bradford
(74) *Attorney, Agent, or Firm* — XSENSUS LLP

(57) ABSTRACT

A display substrate includes: a base; a cathode power line disposed on the base and located in the peripheral region; a first insulating layer located on a side of a layer in which the cathode power line is located away from the base and having first via hole(s); a cathode layer located on the first insulating layer and electrically connected to the cathode power line through the first via hole(s); and spacer(s) located on a side of the cathode layer proximate to the base, a spacer covering at least a side wall of a first via hole, a thickness of a portion of the spacer covering the side wall decreasing along the side (Continued)

wall and in a direction pointing from an end of the side wall proximate to the base toward an end of the side wall of the first via hole away from the base.

19 Claims, 8 Drawing Sheets

(56) References Cited

U.S. PATENT DOCUMENTS

| | | | |
|---|---|---|---|
| 2014/0264315 A1* | 9/2014 | Ono | H10K 59/122 |
| | | | 257/40 |
| 2015/0318305 A1 | 11/2015 | Zhang et al. | |
| 2016/0149155 A1* | 5/2016 | Kim | H10K 59/124 |
| | | | 438/23 |
| 2017/0125725 A1 | 5/2017 | Paek et al. | |
| 2017/0155078 A1* | 6/2017 | Lee | H10K 50/824 |
| 2017/0278910 A1* | 9/2017 | Choi | H10K 59/122 |
| 2019/0326370 A1* | 10/2019 | Lu | H10K 59/1315 |
| 2021/0066672 A1 | 3/2021 | Dai | |
| 2022/0157228 A1* | 5/2022 | Itou | G09F 9/00 |

FOREIGN PATENT DOCUMENTS

| | | |
|---|---|---|
| CN | 106711156 A | 5/2017 |
| CN | 107039486 A | 8/2017 |
| CN | 109962078 A | 7/2019 |
| CN | 110211994 A | 9/2019 |
| CN | 110473835 A | 11/2019 |
| JP | 2005-317932 A | 11/2005 |
| JP | 2009-170395 A | 7/2009 |

\* cited by examiner

DISPLAY SUBSTRATE WITH SPACERS ON CATHODE POWER LINE AND DISPLAY APPARATUS

CROSS-REFERENCE TO RELATED APPLICATIONS

This application is a national phase entry under 35 USC 371 of International Patent Application No. PCT/CN2021/076205, filed on Feb. 9, 2021, which claims priority to Chinese Patent Application No. 202010102481.2, filed on Feb. 19, 2020, which are incorporated herein by reference in their entirety.

TECHNICAL FIELD

The present disclosure relates to the field of display technologies, and in particular, to a display substrate and a display apparatus.

BACKGROUND

The display substrate is one of the core components of the display apparatus, and it has a display region and a peripheral region surrounding the display region. The display substrate includes pixel circuits and light-emitting devices that are stacked on the base and located in the display region; the light-emitting devices are located on a side of the pixel circuits away from the base, and the light-emitting device includes a portion of a cathode layer. The display substrate further includes a cathode power line located in the peripheral region and disposed in a layer where the pixel circuits are located. At least one insulating layer is provided between the cathode power line and the cathode layer; the insulating layer(s) have via hole(s), and the cathode layer is electrically connected to the cathode power line through the via hole(s).

SUMMARY

In one aspect, a display substrate is provided. The display substrate has a display region and a peripheral region surrounding the display region. The display substrate includes a base, a cathode power line, a first insulating layer, a cathode layer and spacer(s). The cathode power line is disposed on the base and located in the peripheral region. The first insulating layer is located on a side of a layer in which the cathode power line is located away from the base, and the first insulating layer has at least one first via hole. The cathode layer is located on a side of the first insulating layer away from the base, and the cathode layer is electrically connected to the cathode power line through the at least one first via hole. The spacer(s) are located on a side of the cathode layer proximate to the base, and a spacer covers at least a side wall of a first via hole. A thickness of a portion of the spacer covering the side wall of the first via hole gradually decreases along the side wall of the first via hole and in a direction pointing from an end of the side wall of the first via hole proximate to the base toward an end of the side wall of the first via hole away from the base.

In some embodiments, the display substrate further includes an anode layer and a pixel defining layer. The anode layer is located between the first insulating layer and the cathode layer. The pixel defining layer is located between the anode layer and the cathode layer. The spacer includes a first portion, and the first portion covers the side wall of the first via hole. The first portion includes a first sub-spacer and/or a second sub-spacer; the first sub-spacer is located in the anode layer; and the second sub-spacer and the pixel defining layer are located in a same layer. In a case where the first portion includes the first sub-spacer and the second sub-spacer, the first sub-spacer and the second sub-spacer are stacked.

In some embodiments, the spacer includes at least the first sub-spacer. The spacer further includes a second portion, and the second portion is electrically connected to the first sub-spacer. The second portion and the first sub-spacer are disposed in a same layer. The second portion covers a portion of the cathode power line exposed by the first via hole, and the second portion is electrically connected to the cathode layer.

In some embodiments, the spacer further includes a third portion, and the third portion is located on a surface of the first insulating layer away from the base and is disposed around the first via hole. The first portion includes the first sub-spacer; the third portion includes a first edge pattern, and the first edge pattern and the first sub-spacer are disposed in a same layer and connected to each other. And/or, the first portion includes the second sub-spacer; the third portion includes a second edge pattern, and the second edge pattern and the second sub-spacer are disposed in a same layer and connected to each other. In a case where the third portion includes both the first edge pattern and the second edge pattern, the first edge pattern and the second edge pattern are stacked.

In some embodiments, the first insulating layer includes a passivation layer and a planarization layer that are stacked. The passivation layer is located on a side of the planarization layer proximate to the base. The first via hole includes a first sub-via hole that is disposed in the passivation layer and a second sub-via hole that is disposed in the planarization layer; and an orthogonal projection of the first sub-via hole on the base is located within an orthogonal projection of the second sub-via hole on the base.

In some embodiments, a contour of an end of the first via hole proximate to the planarization layer coincides with a contour of an end of a second via hole proximate to the passivation layer.

In some embodiments, an orthogonal projection, on the base, of an end of the first via hole proximate to the planarization layer is located within an orthogonal projection, on the base, of an end of the second via hole proximate to the passivation layer.

In some embodiments, the first insulating layer further has at least one second via hole, and the second via hole(s) penetrate at least the passivation layer in the first insulating layer; and the pixel defining layer has at least one third via hole. The display substrate further includes first connection pattern(s). The first connection pattern(s) are located in the anode layer; the first connection pattern(s) are electrically connected to the cathode power line through the at least one second via hole, and the first connection pattern(s) are further electrically connected to the cathode layer through the at least one third via hole.

In some embodiments, region(s) of the planarization layer corresponding to the first connection pattern(s) are hollowed out, and a first connection pattern is embedded in a corresponding hollowed-out portion of the planarization layer.

In some embodiments, the second via hole(s) further penetrate the planarization layer in the first insulating layer. A first connection pattern includes a first connection sub-pattern and a second connection sub-pattern that are electrically connected to each other. The first connection sub-pattern covers at least a side wall of a corresponding second via hole; a thickness of a portion of the first connection sub-pattern covering the side wall of the second via hole gradually decreases along the side wall of the second via hole and in a direction pointing from an end of the side wall of the second via hole proximate to the base toward an end of the side wall of the second via hole away from the base; the first connection sub-pattern is electrically connected to the cathode power line. An orthogonal projection of the second connection sub-pattern on the base is at least partially overlapped with an orthogonal projection of a corresponding third via hole on the base, and the second connection sub-pattern is electrically connected to the cathode layer.

In some embodiments, orthogonal projections of a second via hole and a third via hole that correspond to a same first connection pattern on the base are staggered.

In some embodiments, the display substrate further includes first auxiliary connection pattern(s). The first auxiliary connection pattern(s) are located on a side of the cathode layer away from the base; and a first auxiliary connection pattern covers at least a portion of the cathode layer located in a third via hole and is electrically connected to the cathode layer.

In some embodiments, the display substrate further includes second auxiliary connection pattern(s). The second auxiliary connection pattern(s) are located on a side of the cathode layer away from the base; and a second auxiliary connection pattern covers at least a portion of the cathode layer located in the first via hole and is electrically connected to the cathode layer.

In some embodiments, the second auxiliary connection pattern is capable of transmitting light. In a case where the display substrate further includes first auxiliary connection pattern(s), the first auxiliary connection pattern is also capable of transmitting light.

In some embodiments, the display substrate further includes a gate metal layer, a source-drain metal layer and a second insulating layer. The gate metal layer is disposed between the base and the first insulating layer; the source-drain metal layer is disposed between the gate metal layer and the first insulating layer; and the second insulating layer is disposed between the gate metal layer and the source-drain metal layer. The cathode power line is located in the gate metal layer or the source-drain metal layer.

In some embodiments, the cathode power line is located in the gate metal layer. The display substrate further includes second connection pattern(s), and the second connection pattern(s) are located in the source-drain metal layer. The cathode layer is electrically connected to the second connection pattern(s) through the at least one first via hole. The second insulating layer has at least one fourth via hole, and the second connection pattern(s) are electrically connected to the cathode power line through the at least one fourth via hole.

In some embodiments, the peripheral region includes a first peripheral sub-region, a second peripheral sub-region, a third peripheral sub-region, and a fourth peripheral sub-region. The first peripheral sub-region and the second peripheral sub-region are located on two opposite sides of the display region along a second direction, and the third peripheral sub-region and the fourth peripheral sub-region are located on two opposite sides of the display region along a first direction. The first direction is a row direction in which sub-pixels are arranged in the display region, and the second direction is a column direction in which sub-pixels are arranged in the display region. The first peripheral sub-region is a region for realizing electrical connection with a circuit board; and the first via hole(s) are located in at least one of the second peripheral sub-region, the third peripheral sub-region, and the fourth peripheral sub-region.

In another aspect, a display device provided. The display device includes the display substrate as described in any one of the above embodiments.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, and are not limitations on actual sizes of products, actual processes of methods and actual timings of signals involved in the embodiments of the present disclosure.

DETAILED DESCRIPTION

Figure 1:
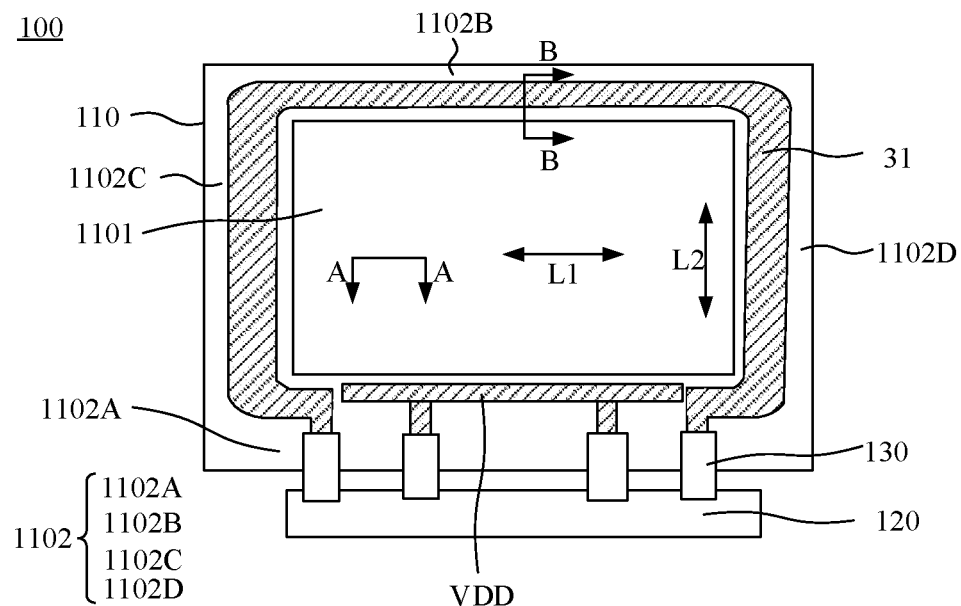
FIG. 1 is a plan view of a display apparatus, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "some embodiments", "exemplary embodiments" and "example" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, terms "first" and "second" are only used for descriptive purposes, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

In the description of some embodiments, the term "connected" and derivatives thereof may be used. For example, the term "connected" may be used in the description of some embodiments to indicate that two or more components are in direct physical contact or electrical contact with each other.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, depending on the context, the term "if" is optionally construed as "when" or "in a case where".

Exemplary embodiments are described herein with reference to sectional views and/or plan views as idealized exemplary drawings. In the accompanying drawings, thickness of layers and sizes of regions are enlarged for clarity. Variations in shape with respect to the drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a feature of being curved. Therefore, the regions shown in the accompanying drawings are schematic in nature, and their shapes are not intended to show actual shapes of the region in a device, and are not intended to limit the scope of the exemplary embodiments.

As shown in FIG. 1, some embodiments of the present disclosure provide a display apparatus 100. The display apparatus 100 may be any product or component having a display function, such as a television, a monitor, a notebook computer, a tablet computer, a mobile phone, a navigator, etc.

In some embodiments, the display apparatus 100 may be an electroluminescent display apparatus or a photoluminescent display apparatus. In a case where the display apparatus 100 is an electroluminescent display apparatus, the electroluminescent display apparatus may be an organic light-emitting diode (OLED) display apparatus or a quantum dot light-emitting diode (QLED) display apparatus. In a case where the display apparatus is a photoluminescent display apparatus, the photoluminescent display apparatus may be a quantum dot photoluminescent display apparatus.

The display apparatus 100 includes a display substrate 110. The display substrate 110 have a display region 1101 and a peripheral region 1102, and the peripheral region 1102 may surround the display region 1101 (as shown in FIG. 1), or may only be located on one or more sides of the display region 1101.

Figure 2:
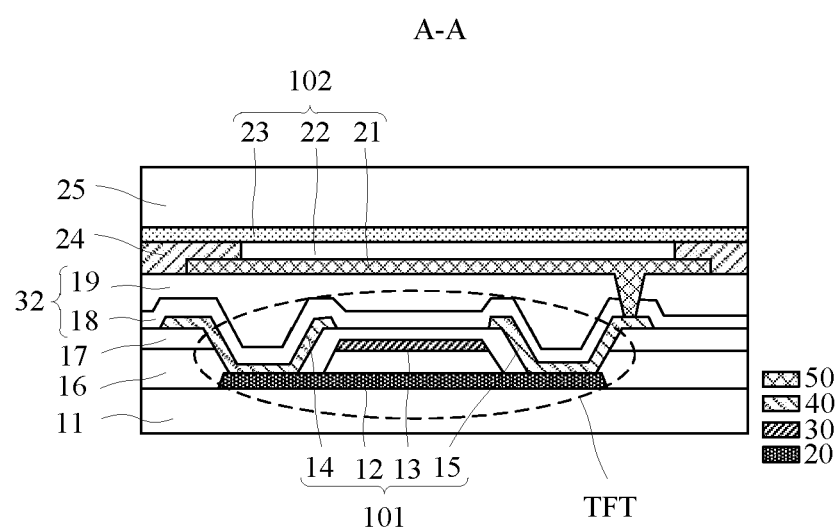
FIG. 2 is a sectional view of the display apparatus in FIG. 1 taken along the line A-A.

For example, in a case where the display apparatus 100 is an OLED display apparatus, the display region 1101 is provided with a plurality of sub-pixels 10 therein, and the sub-pixels 10 are used for displaying an image. Referring to FIG. 2 (which is a sectional view of a sub-pixel 10 in the display region 1101 in FIG. 1), each sub-pixel 10 includes a pixel circuit 101 and a light-emitting device 102 that are disposed on a base 11.

The pixel circuit 101 includes a plurality of thin film transistors TFT. Referring to FIG. 2 (which shows a section of a thin film transistor TFT, which serves as a driving transistor for driving the light-emitting device 102, in the plurality of thin film transistors TFT), the thin film transistor TFT includes an active pattern 12, a gate 13, and a source 14 and a drain 15 that are disposed on the base 11. Here, a layer in which the active pattern 12 is located is a semiconductor layer 20; a layer in which the gate 13 is located is referred to as a gate metal layer 30; and a layer in which the source 14 and the drain 15 are located is referred to as a source-drain metal layer 40.

Referring to FIG. 2, a gate insulating layer 16 is provided between the semiconductor layer 20 and the gate metal layer 30; and a second insulating layer 17 is provided between the gate metal layer 30 and the source-drain metal layer 40. In addition, a passivation layer 18 and a planarization layer 19 are provided on a side of the source-drain metal layer 40 away from the base 11.

With continued reference to FIG. 2, the light-emitting device 102 is located on a side of a layer in which the pixel circuit 101 is located away from the base 11. The light-emitting device 102 includes an anode 21, a light-emitting functional layer 22 and a portion of a cathode layer 23. The anode 21 of the light-emitting device 102 is electrically connected to the drain 15 of the thin film transistor TFT that serves as the driving transistor in the plurality of thin film transistors TFT. A layer in which the anode 12 is located is an anode layer 50.

Referring to FIG. 2, the display substrate 110 further includes a pixel defining layer 24 and an encapsulation layer 25. The pixel defining layer 24 includes a plurality of openings; a single light-emitting device 102 corresponds to a single opening, and the light-emitting functional layer 22 of the light-emitting device 102 is at least partially disposed in the corresponding opening. The encapsulation layer 25 is located on a side of the cathode layer 23 away from the base 11, and the encapsulation layer 23 may be an encapsulation substrate or an encapsulation film, which is not limited here.

In some embodiments, the light-emitting device 102 further includes one or more of an electron transport layer (ETL), an electron injection layer (EIL), a hole transport layer (HTL), or a hole injection layer (HIL).

The display substrate 110 may be a top emission type display substrate, in which case relative to the light-emitting functional layer 22, the anode 21 close to the base 11 is opaque and the cathode layer 23 far away from the base 11 is transparent or semi-transparent. The display substrate 110 may also be a bottom emission type display substrate, in which case relative to the light-emitting functional layer 22, the anode 21 close to the base 11 is transparent or semi-transparent, and the cathode layer 23 far away from the base 11 is opaque. The display substrate 110 may also be a double-sided emission type display substrate, in which case relative to the light-emitting functional layer 22, the anode 21 close to the base 11 and the cathode layer 23 far away from the base 11 are both transparent or semi-transparent.

The peripheral region 1102 of the display substrate 110 is provided with a plurality of signal lines therein, and the signal lines are located in the layer where the pixel circuit 101 is located. The plurality of signal lines include at least one cathode power line 31 for supplying a power signal to the cathode layer 23. The cathode layer 23 is located in the display region 1101 and extends to a portion of the peripheral region 1102, the cathode layer 23 is electrically connected to the cathode power line(s) 31 through via hole(s), and the via hole(s) are located in at least one insulating layer that is provided between the cathode layer 23 and the cathode power line(s) 31.

Figure 3:
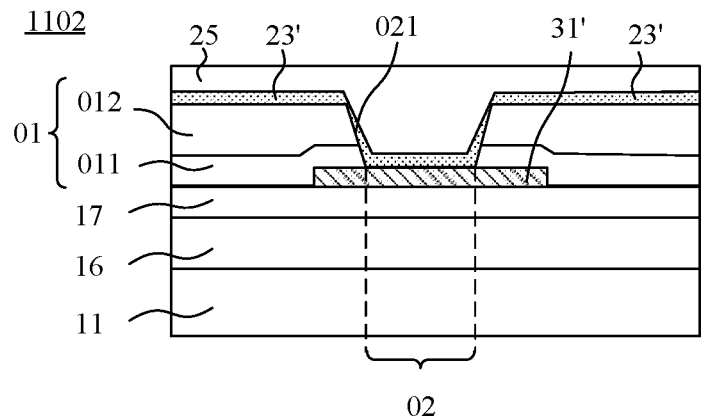
FIG. 3 is a structural diagram showing a connection between a cathode layer and a cathode power line in the related art.

In the related art, referring to FIG. 3, insulating layers 01 located between a cathode power line 31' and a cathode layer 23' includes at least a passivation layer 011 and a planarization layer 012. A total thickness of the insulating layers 01 (a dimension of a whole of the insulating layers 01 in a thickness direction of the base 11) is large, resulting in a large depth of a via hole 02 formed in the insulating layers 01. In addition, a slope of a side wall 021 of the via hole 02 (an angle between the side wall 021 of the via hole 02 and a plane perpendicular to the thickness direction of the base 11) is large. Particularly, in medium and large-sized products and high-resolution products, since the planarization layer 012 can only be made of a silicone material, a portion of the via hole 02 located in the planarization layer 012 needs to be formed by a dry etching process, and the slope of the side wall 021 of the portion of the via hole 02 formed by dry etching is even larger. The cathode layer 23' is generally fabricated by a vapor deposition process, during which the cathode material is deposited in the thickness direction of the base 11 to form the cathode layer 23'; and the thickness of the cathode layer 23' is generally very small (in a range of 100 angstroms to 200 angstroms), so as to ensure a light extraction rate of the cathode layer 23'. The depth and slope of the side wall 021 of the via hole 02 are both large, and the thickness of the cathode layer 23' is small, so that the thickness of a portion of the cathode layer 23' located on the side wall 021 of the via hole 02 is very small, and a resistance of the cathode layer 23' at the position of the via hole 02 is very large. As a result, there is a great risk of the cathode layer 23' breaking on the side wall 021 of the via hole 02.

Figure 4:
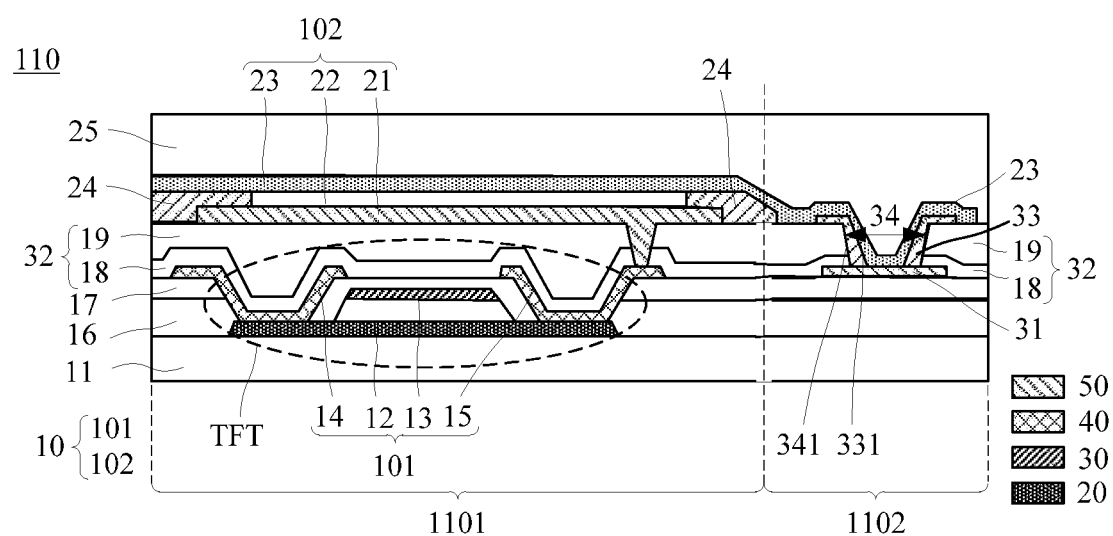
FIG. 4 is a sectional view of the display apparatus in FIG. 1 taken along the line B-B.
Figure 5A:
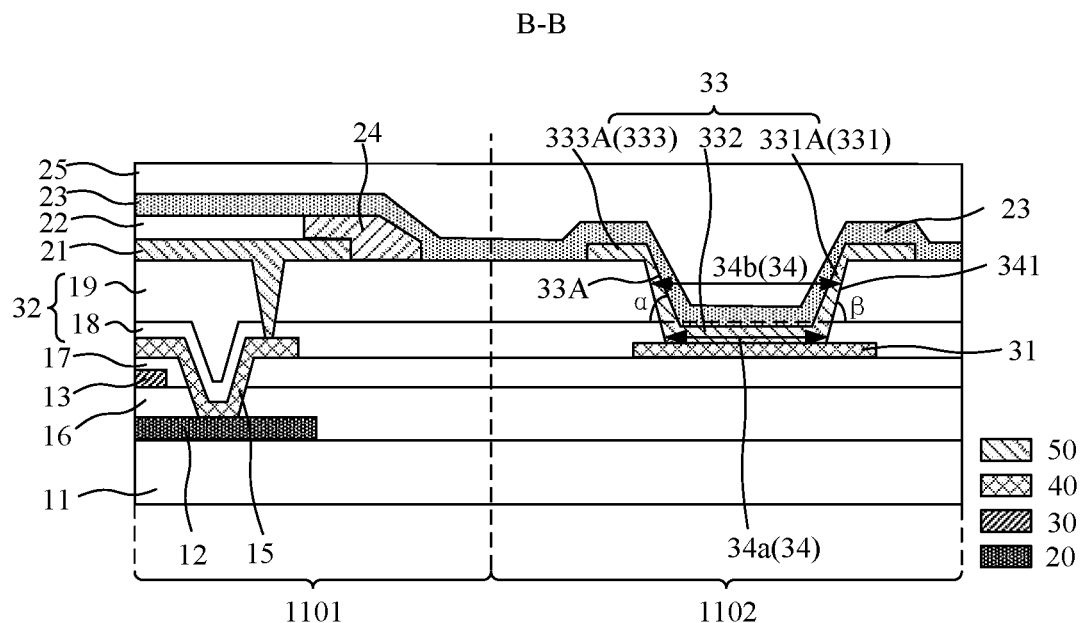
FIG. 5A is a diagram showing a display substrate in which a spacer is located in an anode layer, in accordance with some embodiments.

In some embodiments, referring to FIGS. 4 and 5A, the display substrate 110 includes the base 11, the cathode power line 31, a first insulating layer 32, the cathode layer 23, and spacer(s) 33. The cathode power line 31 is disposed on the base 11, and is located in the peripheral region 1102. The first insulating layer 32 is located on a side, away from the base 11, of a layer in which the cathode power line 31 is located, and the first insulating layer 32 has at least one first via hole 34. The cathode layer 23 is located on a side of the first insulating layer 32 away from the base 11, and the cathode layer 23 is electrically connected to the cathode power line 31 through the at least one first via hole 34. The spacer 33 is located on a side of the cathode layer 23 proximate to the base 11 and covers at least a side wall 341 of the first via hole 34. A thickness of a portion of the spacer 33 covering the side wall 341 of the first via hole 34 gradually decreases along the side wall 341 of the first via hole 34 and in a direction pointing from an end of the side wall 341 proximate to the base 11 toward an end of the side wall 341 away from the base 11.

Referring to FIGS. 4 and 5A, the thickness of the portion of the spacer 33 covering the side wall 341 of the first via hole 34 gradually decreases along the side wall 341 of the first via hole 34 and in the direction pointing from the end of the side wall 341 proximate to the base 11 toward the end of the side wall 341 away from the base 11, so that a slope angle α of a side wall 33A of the portion of the spacer 33 away from the side wall 341 (i.e., an included angle between the side wall 33A of the portion of the spacer 33 and a plane where the first insulating layer 32 is located) is smaller than a slope angle β of the side wall 341 of the first via hole 34 (i.e., an included angle between the side wall 341 of the first via hole 34 and the plane where the first insulating layer 32 is located), and a thickness of the cathode material deposited on the side wall 33A of the spacer 33 may be increased. The spacer 33 is able to reduce a climbing difficulty of a material of the cathode layer 23 in the first via hole 34, and thus ensure the thickness and continuity of the portion of the cathode layer 23 on the side wall 341 of the first via hole 34, reduce a resistance of the cathode layer 23 at the first via hole 34, and reduce a risk of the cathode layer 23 breaking at the first via hole 34.

It will be noted that, the spacer 33 may be formed by film-forming, exposure, etching, and other processes. The film-forming process may be a vapor deposition process. When the spacer 33 is formed by the vapor deposition process, since the slope of the side wall 341 of the first via hole 34 is large, after a material of the spacer 33 is deposited on the side wall 341 of the first via hole 34, it will roll along the side wall 341 of the first via hole 34 and toward the base 11 in an initial stage; as a result, for the portion of the spacer 33 covering the side wall 341 of the first via hole 34, a thickness of an end thereof proximate to the base 11 is greater than a thickness of an end thereof away from the base 11 (that is, the thickness of the portion of the spacer 33 covering the side wall 341 of the first via hole 34 gradually decreases along the side wall 341 of the first via hole 34 and in the direction pointing from the end of the side wall 341 proximate to the base 11 toward the end of the side wall 341 away from the base 11).

Thus, the slope angle α of the side wall 33A of the portion of the spacer 33 away from the side wall 341 of the first via hole 34 is smaller than the slope angle β of the side wall 341 of the first via hole 34, and the spacer 33 is able to improve the climbing ability of the material of the cathode layer 23 in the first via hole 34, and thereby ensure the thickness and continuity of the portion of the cathode layer 23 on the side wall 33A of the spacer 33.

In addition, in the etching process, etching conditions may be controlled such that the thickness of the portion of the spacer 33 covering the side wall 341 of the first via hole 34 gradually decreases along the side wall 341 of the first via hole 34 and in the direction pointing from the end of the side wall 341 proximate to the base 11 toward the end of the side wall 341 away from the base 11, so as to further reduce the slope angle α of the side wall 33A of the portion of the spacer 33, and further reduce the climbing difficulty of the material of the cathode layer 23 in the first via hole 34.

In some embodiments, referring to FIG. 4, the display substrate 110 further includes the anode layer 50 and the pixel defining layer 24. The anode layer 50 includes a plurality of anodes 21, and an orthogonal projection, on the base 11, of a single anode 21 is overlapped with an orthogonal projection, on the base 11, of a corresponding opening in the pixel defining layer 24. The anode layer 50 is located between the first insulating layer 32 and the cathode layer 23, and the pixel defining layer 24 is located between the anode layer 50 and the cathode layer 23.

Figure 5B:
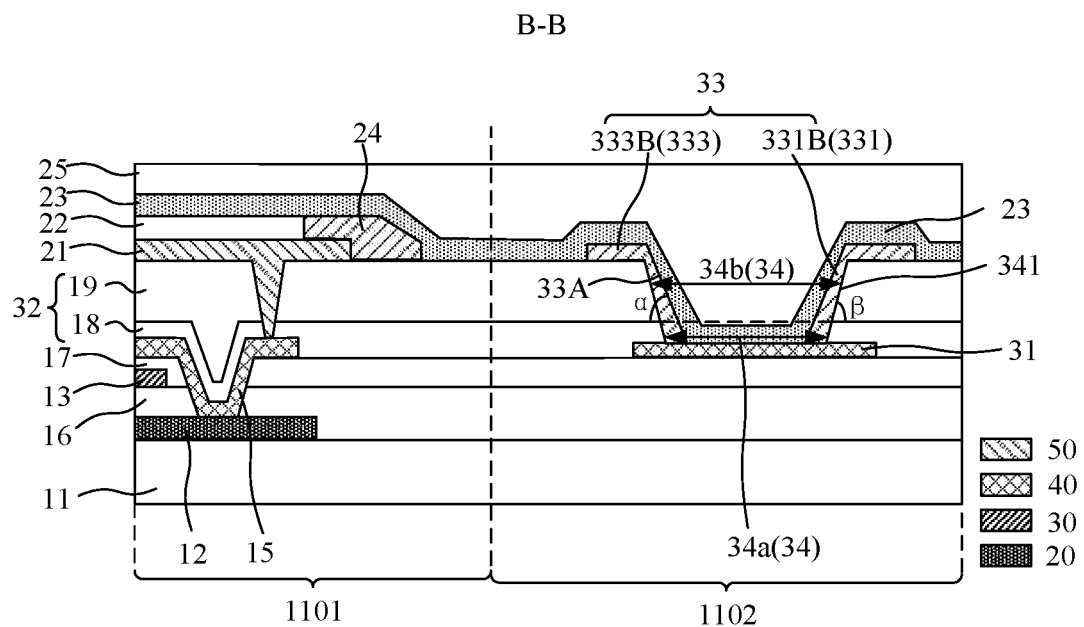
FIG. 5B is a diagram showing a display substrate in which a spacer and a pixel defining layer are disposed in a same layer, in accordance with some embodiments.
Figure 5C:
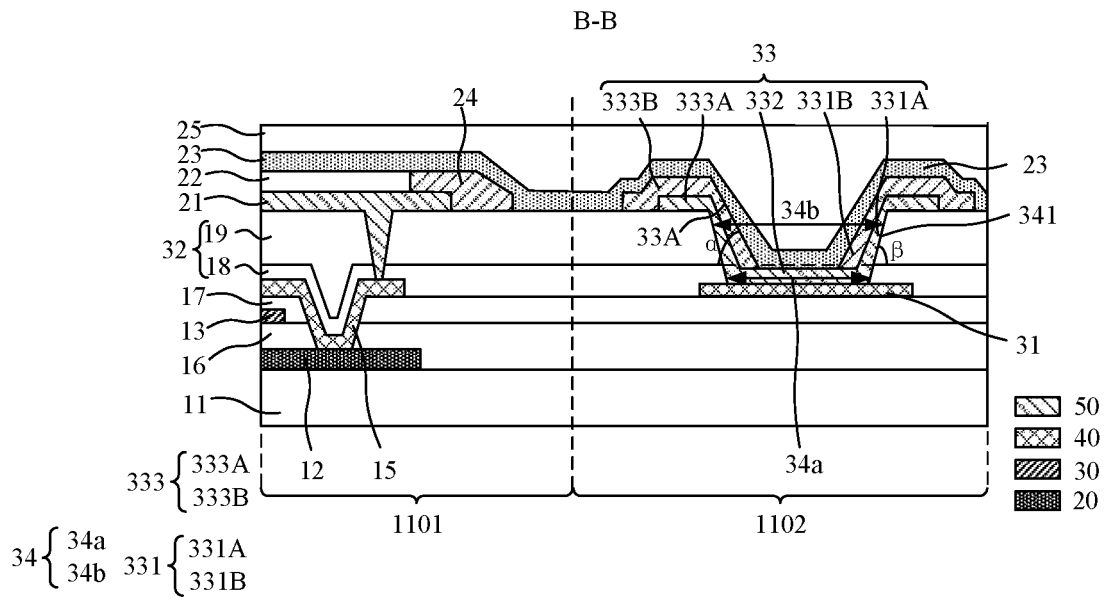
FIG. 5C is a diagram showing a display substrate in which a first sub-spacer in a spacer is located in an anode layer, and a second sub-spacer in the spacer and a pixel defining layer are disposed in a same layer, in accordance with some embodiments.

Referring to FIGS. 5A to 5C, the spacer 33 includes a first portion 331, and the first portion 331 covers the side wall 341 of the first via hole 34. The first portion 331 includes a first sub-spacer 331A and/or a second sub-spacer 331B. The first sub-spacer 331A is located in the anode layer 50, and the second sub-spacer 331B and the pixel defining layer 24 are disposed in the same layer. In a case where the first portion includes the first sub-spacer 331A and the second sub-spacer 331B, as shown in FIG. 5C, the first sub-spacer 331A and the second sub-spacer 331B are stacked. The first sub-spacer 331A may be formed during a process of forming the plurality of anodes 21, and the second sub-spacer 331B may be formed during a process of forming the pixel defining layer 24, which simplifies the manufacturing steps of the display substrate 110.

For example, referring to FIG. 5A, the spacer 33 includes a first portion 331, the first portion 331 includes a first sub-spacer 331A, and the first sub-spacer 331A is located in the anode layer 50. That is, the first sub-spacer 331A and the plurality of anodes 21 are made of the same material and formed in the same layer. The first sub-spacer 331A may not only reduce the climbing difficulty of the material of the cathode layer 23 in the first via hole 34, but may also be connected in parallel with the portion of the cathode layer 23 in the first via hole 34, and thus further reduce the resistance of the cathode layer 34 at the first via hole.

For example, referring to FIG. 5B, the spacer 33 includes a first portion 331, the first portion 331 includes a second sub-spacer 331B, and the second sub-spacer 331B and the pixel defining layer 24 are disposed in the same layer. The second sub-spacer 331B may reduce the climbing difficulty of the material of the cathode layer 23 in the first via hole 34, and increase the thickness of the portion of the cathode layer 23 on the side wall 341 of the first via hole 34.

For example, referring to FIG. 5C, the spacer 33 includes a first portion 331, the first portion 331 includes a first sub-spacer 331A and a second sub-spacer 331B. Based on the manufacturing sequence of the anode layer 50 and the pixel defining layer 24, the first sub-spacer 331A and the second sub-spacer 331B are stacked, and the first sub-spacer 331A is located on a side of the second sub-spacer 331B proximate to the side wall 341 of the first via hole 34.

Referring to FIGS. 5A and 5C, in a case where the spacer 33 includes at least the first sub-spacer 331A, the spacer 33 further includes a second portion 332. The second portion 332 is located in the anode layer 50, and the second portion 332 is electrically connected to the first sub-spacer 331A. The second portion 332 covers a portion of the cathode power line 31 exposed by the first via hole 34, and the second portion 332 is electrically connected to the cathode layer 23. For example, the second portion 332 and the first sub-spacer 331A are connected to form a one-piece structure. Since the first sub-spacer 331A and the second portion 332 are located in the anode layer 50 and cover the side wall 341 of the first via hole 34 and the portion of the cathode power line 31 exposed by the first via hole 34, the first sub-spacer 331A and the second portion 332 may be connected in parallel with the portion of the cathode layer 23 located in the first via hole 34, so as to reduce the resistance of the cathode layer 23 at the first via hole 34. In addition, in a process of patterning an anode film to form the anode layer 50, the anodes 21, the first sub-spacer 331A and the second portion 332 in the spacer 33 are obtained at the same time, so that the difficulty of forming the spacer 33 may be reduced.

In some embodiments, referring to FIGS. 5A to 5C, the spacer 33 further includes a third portion 333. The third portion 333 is located on a surface of the first insulating layer 32 away from the base 11 and surrounds the first via hole 34 (the end of the side wall of the first via hole 34 away from the base 11). The third portion 333 is used to ensure the continuity of the spacer 33 at the first via hole 34, to ensure that the first portion 331 of the spacer 33 completely covers the side wall 341 of the first via hole 34, to reduce the requirements on the accuracy of the shape, position and size of the spacer 33, and to reduce the manufacturing cost of the spacer 33.

Referring to FIG. 5A, in a case where the first portion 331 includes the first sub-spacer 331A, the third portion 333 includes a first edge pattern 333A. The first edge pattern 333A and the first sub-spacer 331A are disposed in the same layer and connected to each other. For example, the first edge pattern 333A, the first sub-spacer 331A and the second portion 332 are connected as a whole. The first edge pattern 333A is located in the anode layer 50.

Referring to FIG. 5B, in a case where the first portion 331 includes the second sub-spacer 331B, the third portion 333 includes a second edge pattern 333B. The second edge pattern 333B and the second sub-spacer 331B are disposed in the same layer and connected to each other. For example, the second edge pattern 333B and the second sub-spacer 331B are connected as a whole. The second edge pattern 333B and the pixel defining layer 24 are disposed in the same layer.

Referring to FIG. 5C, the third portion 333 includes the first edge pattern 333A and the second edge pattern 333B, and the first edge pattern 333A and the second edge pattern 333B are stacked. Based on a manufacturing sequence of the anode layer 50 and the pixel defining layer 24, the first edge pattern 333A is located on a side of the second edge pattern 333B proximate to the base 11.

In some embodiments, referring to FIG. 5C, the first insulating layer 32 includes a passivation layer 18 and a planarization layer 19 that are stacked; and the passivation layer 18 is located on a side of the planarization layer 19 proximate to the base 11. The first via hole 34 includes a first sub-via hole 34a disposed in the passivation layer 18 and a second sub-via hole 34b disposed in the planarization layer 19; and an orthogonal projection of the first sub-via hole 34a on the base 11 is located within an orthogonal projection of the second sub-via hole 34b on the base 11.

Figure 6:
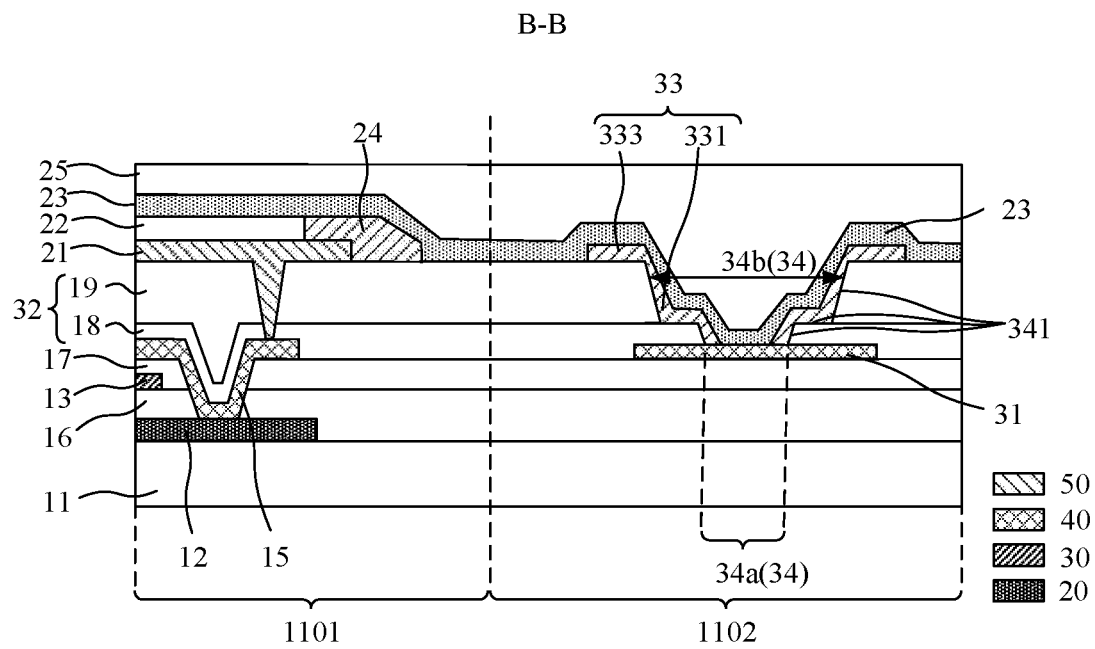
FIG. 6 is a diagram showing a display substrate in which a first via hole is a stepped via hole, in accordance with some embodiments.

The arrangement that the orthogonal projection of the first sub-via hole 34a on the base 11 is located within the orthogonal projection of the second sub-via hole 34b on the base 11 may be that, a contour of an end of the first sub-via hole 34a proximate to the planarization layer 19 coincides with a contour of an end of the second sub-via hole 34b proximate to the passivation layer 18 (as shown in FIG. 5C); it may also be that, an orthogonal projection, on the base 11, of the end of the first sub-via hole 34a proximate to the planarization layer 19 is located within an orthogonal projection, on the base 11, of the end of the second sub-via hole 34b proximate to the passivation layer 18 (as shown in FIG. 6).

For example, referring to FIG. 6, in a case where the orthogonal projection, on the base 11, of the end of the first sub-via hole 34a proximate to the planarization layer 19 is located within the orthogonal projection, on the base 11, of the end of the second sub-via hole 34b proximate to the passivation layer 18, the first via hole 34 is a stepped hole, the side wall 341 of the first via hole 34 is divided into three sections (e.g., including two inclined sections, and one horizontal section located between the two inclined sections and connected to the two inclined sections), and a depth of the first sub-via hole 34a and a depth of the second sub-via hole 34b are both small. In this way, it may be possible to further increase the climbing ability of the material of the cathode layer 23 on the side wall 341 of the first via hole 34, increase a thickness of a portion of the cathode layer 23 located on a side wall 341 of the first sub-via hole 34a and a thickness of a portion of the cathode layer 23 located on a side wall 341B of the second sub-via hole 34b, reduce the resistance of the portion of the cathode layer 23 located on the side wall 341 of the first via hole 34, and reduce the risk of breaking of the portion of the cathode layer 23 located on the side wall 341 of the first via hole 34.

Figure 7A:
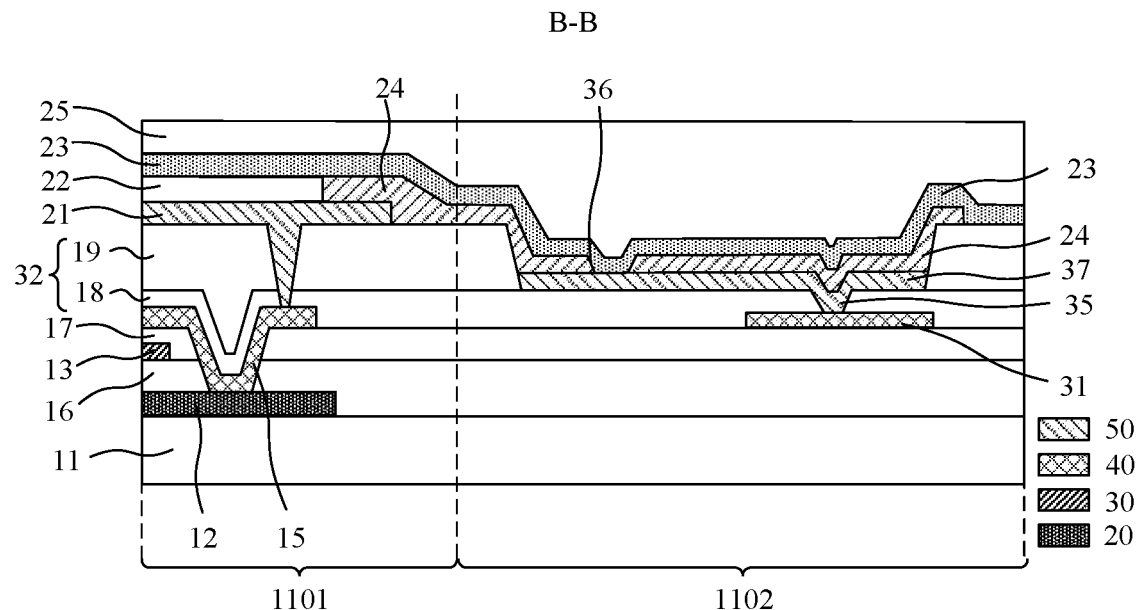
FIG. 7A is a diagram showing a display substrate in which a pixel defining layer is located in a portion of a peripheral region, in accordance with some embodiments.

In some embodiments, referring to FIG. 7A, the pixel defining layer 24 is located in the display region 1101 and extends in a portion of the peripheral region 1102. For example, the pixel defining layer 24 is further provided between the cathode layer 23 and the cathode power line 31. That is, the passivation layer 18, the planarization layer 19, and the pixel defining layer 24 are provided between the cathode layer 23 and the cathode power line 31.

Figure 7B:
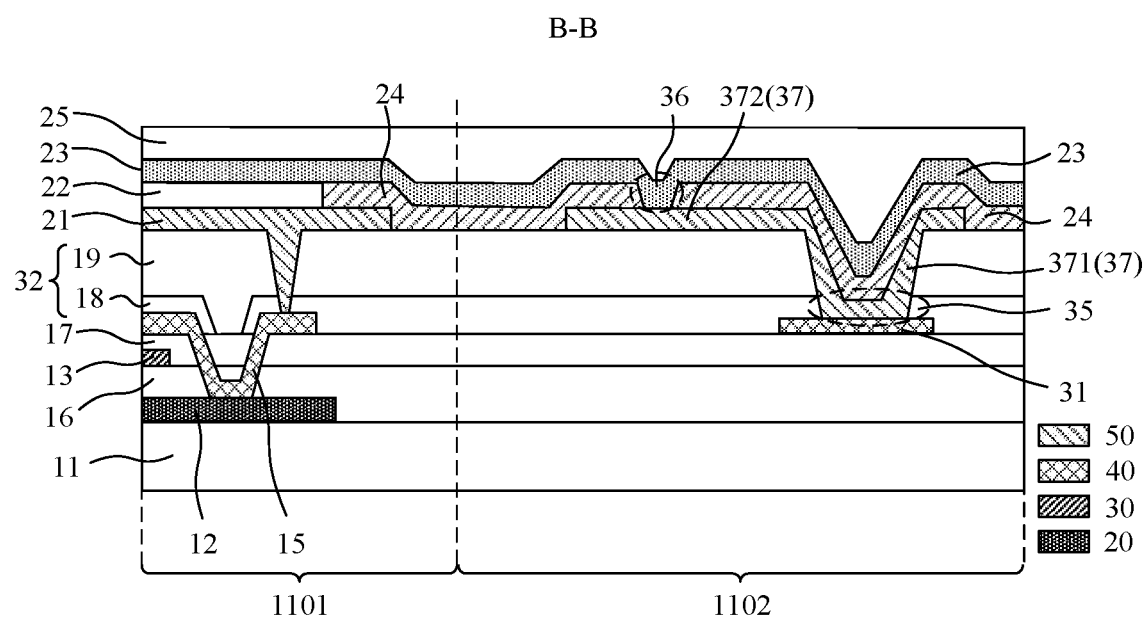
FIG. 7B is a diagram showing another display substrate in which a pixel defining layer is located in a portion of a peripheral region, in accordance with some embodiments.
Figure 8:
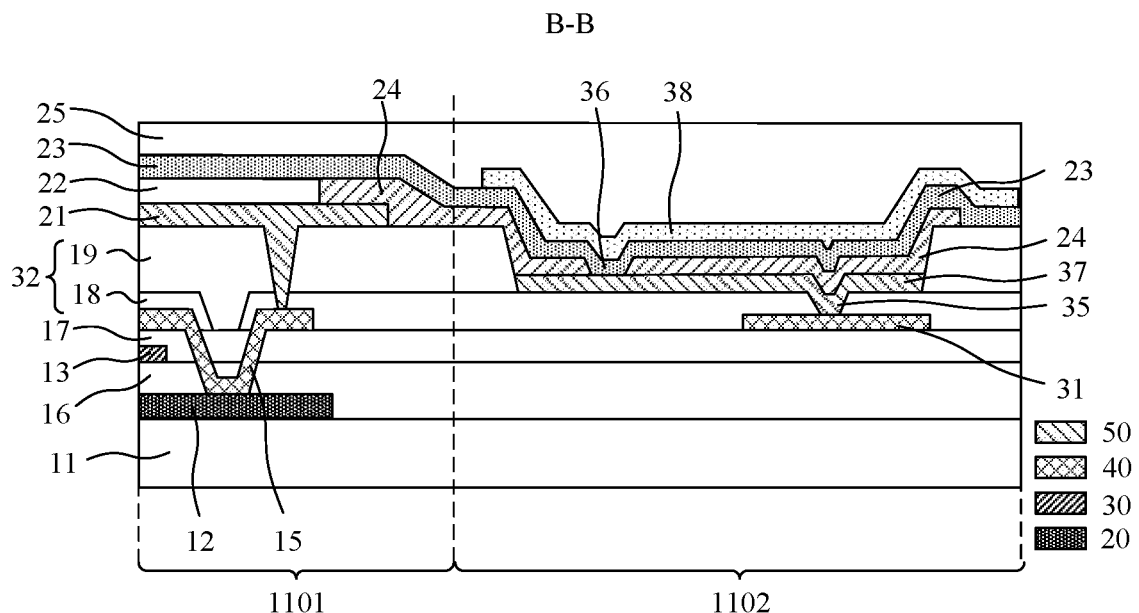
FIG. 8 is a diagram showing a display substrate including a first auxiliary connection pattern, in accordance with some embodiments.

In some embodiments, as shown in FIGS. 7A, 7B and 8, the first insulating layer 32 further has at least one second via hole 35, and the second via hole(s) 35 penetrate at least the passivation layer 18 in the first insulating layer 32. The pixel defining layer 24 has at least one third via hole 36. The display substrate 110 further includes first connection pattern(s) 37. The first connection pattern(s) 37 are located in the anode layer 50, and are electrically connected to the cathode power line 31 through the at least one second via hole 35. The first connection pattern(s) 37 are further electrically connected to the cathode layer 23 through the at least one third via hole 36.

The anode layer 50 is located between the planarization layer 19 and the pixel defining layer 24. The first connection pattern 37 is connected to the cathode power line 31 through the second via hole 35, and is also connected to the cathode layer 23 through the third via hole 36. In this case, the second via hole 35 and the third via hole 36 have small depth, so that the depth of a single via hole formed in layer(s) between the cathode layer 23 and the cathode power line 31 is reduced. In addition, the first connection pattern(s) 37 may be formed by an existing process for manufacturing the display substrate without adding a new process, so that the cost of manufacturing the first connection pattern(s) 37 is low.

Referring to FIG. 7A, a region of the planarization layer 19 corresponding to the first connection pattern 37 is hollowed out, and the first connection pattern 37 is embedded in a hollowed-out portion of the planarization layer 19, so as to reduce the depth of the second via hole 35 and avoid excessive resistance of a portion of the first connection pattern 37 covering a side wall of the second via hole 35.

In some embodiments, referring to FIG. 7A, orthogonal projections of the second via hole 35 and the third via hole 36 that correspond to the same first connection pattern 37 on the base 11 are staggered. That is, an orthogonal projection of the second via hole 35 corresponding to a first connection pattern 37 on the base 11 is at least partially non-overlapped with an orthogonal projection of the third via hole 36 corresponding to the same first connection pattern 37 on the base 11. In this way, it may not only be possible to reduce the depth of the third via hole 36, but it may also be possible to optimize a space for a wiring of the cathode power line 31.

In some embodiments, referring to FIG. 7B, the second via hole 35 further penetrates the planarization layer 19 in the first insulating layer 32, and the first connection pattern 37 is located between the pixel defining layer 24 and the planarization layer 19. The first connection pattern 37 includes a first connection sub-pattern 371 and a second connection sub-pattern 372 that are electrically connected to each other. The first connection sub-pattern 371 covers at least the side wall of the second via hole 35. A thickness of a portion of the first connection sub-pattern 371 covering the side wall of the second via hole 35 gradually decreases along the side wall of the second via hole 35 and in a direction pointing from an end of the side wall of the second via hole 35 proximate to the base 11 toward an end of the side wall of the second via hole 35 away from the base 11. The first connection sub-pattern 371 is electrically connected to the cathode power line 31. An orthogonal projection of the second connection sub-pattern 372 on the base 11 is at least partially overlapped with the orthogonal projection of the third via hole 36 on the base 11, and the second connection sub-pattern 36 is electrically connected to the cathode layer 23. As a result, a slope of a side wall of a portion of the pixel defining layer 24 covering the second via hole 35 is reduced, thereby reducing the climbing difficulty of the material of the cathode layer 23 in the second via hole 35.

In some embodiments, referring to FIG. 8, the display substrate 110 further includes first auxiliary connection pattern(s) 38. The first auxiliary connection pattern(s) 38 are located on a side of the cathode layer 23 away from the base 11. The first auxiliary connection pattern 38 covers at least a portion of the cathode layer 23 located in the third via hole 36, and is electrically connected to the cathode layer 23. The first auxiliary connection pattern 38 is connected in parallel with the portion of the cathode layer 23 located in the third via hole 36, so as to reduce the resistance of the cathode layer 23 at the third via hole 36.

Figure 9:
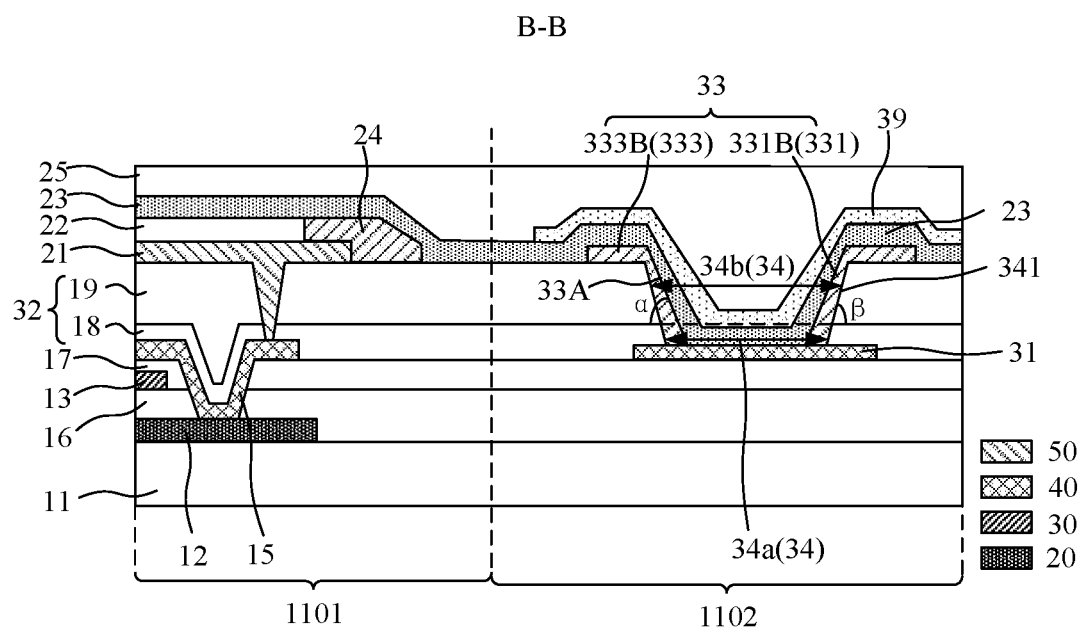
FIG. 9 is a diagram showing a display substrate including a second auxiliary connection pattern, in accordance with some embodiments.

Referring to FIG. 9, the display substrate 110 further includes second auxiliary connection pattern(s) 39. The second auxiliary connection pattern(s) 39 are located on a side of the cathode layer 23 away from the base 11. The second auxiliary connection pattern 39 covers at least the portion of the cathode layer 23 located in the first via hole 34, and is electrically connected to the cathode layer 23. The second auxiliary connection pattern 39 is connected in parallel with the portion of the cathode layer 23 located in the first via hole 34, so as to reduce the resistance of the cathode layer 23 at the first via hole 34.

In a case where the display substrate 110 includes the second auxiliary connection pattern(s) 39, the second auxiliary connection pattern(s) 39 is capable of transmitting light. In a case where the display substrate 110 includes the first auxiliary connection pattern(s) 38, the first auxiliary connection pattern 38 is also capable of transmitting light.

In a case where the first auxiliary connection pattern(s) 38 and/or the second auxiliary connection pattern(s) 39 are located on the side of the cathode layer 23 away from the base 11, and the display substrate 110 is a top emission type display substrate, the first auxiliary connection pattern(s) 38 and/or the second auxiliary connection pattern(s) 39 are made of a light-transmitting material, which may reduce an influence of the first auxiliary connection pattern(s) 38 and/or the second auxiliary connection pattern(s) 39 on the light transmission efficiency.

For example, the first auxiliary connection pattern(s) 38 may be made of indium tin oxide (ITO), indium zinc oxide (IZO), etc. The second auxiliary connection pattern(s) 39 may be made of ITO, IZO, etc.

In some embodiments, referring to FIG. 2, the display substrate 110 further includes the gate metal layer 30, the source-drain metal layer 40 and the second insulating layer 17. The gate metal layer 30 is disposed between the base 11 and the second insulating layer 17. The source-drain metal layer 40 is disposed between the gate metal layer 30 and the first insulating layer(s) 32. The second insulating layer 17 is disposed between the gate metal layer 30 and the source-drain metal layer 40. The cathode power line 31 is located in the gate metal layer 30 (as shown in FIG. 10) or the source-drain metal layer 40 (as shown in FIG. 5B).

For example, in a case where the cathode power line 31 is located in the source-drain metal layer 40, referring to FIG. 5B, a distance between the cathode power line 31 and the cathode layer 23 is very small; the depth of the first via hole 34 connecting the cathode power line 31 and the cathode layer 23 is very small, and the climbing difficulty of the material of the cathode layer 23 in the first via hole 34 is very low.

Figure 10:
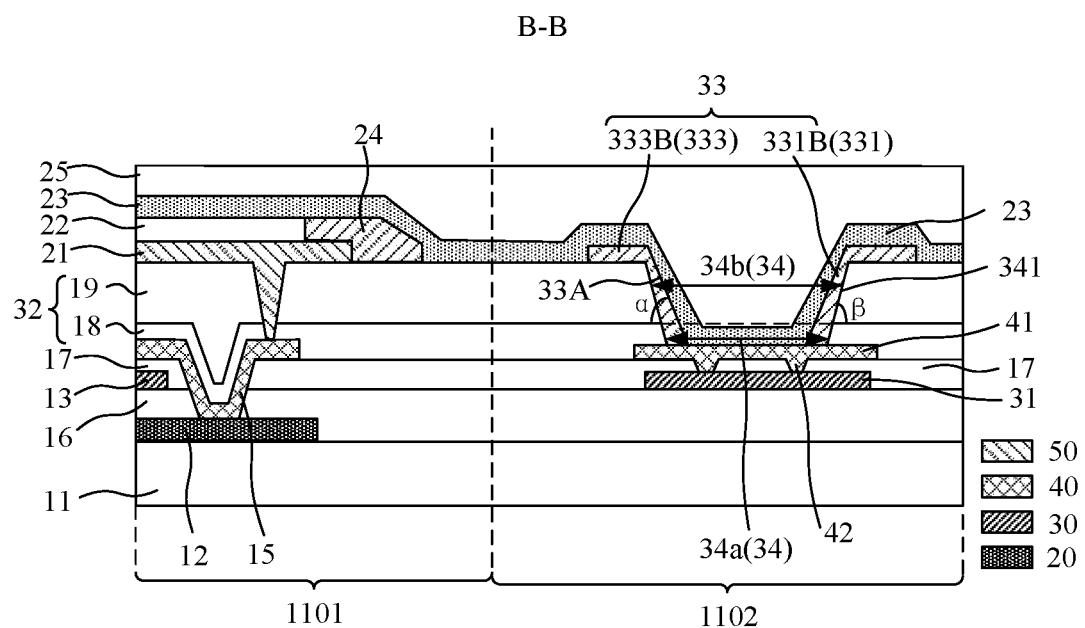
FIG. 10 is a diagram showing a display substrate in which a cathode power line is located in a gate metal layer, in accordance with some embodiments.

For example, in consideration of the arrangement of other signal lines in the peripheral region 1102, referring to FIG. 10, the cathode power line 31 may also be located in the gate metal layer 30. In this case, the display substrate 110 further includes second connection pattern(s) 41, and the second connection pattern(s) 41 are located in the source-drain metal layer 40. The cathode layer 31 is electrically connected to the second connection pattern(s) 41 through the at least one first via hole 34. The second insulating layer 17 has at least one fourth via hole 42, and the second connection pattern(s) 41 are electrically connected to the cathode power line 31 through the at least one fourth via hole 42. The second connection pattern 41 may reduce a depth of the first via hole 34 and improve the climbing ability of the material of the cathode layer 23 in the first via hole 34, thereby ensuring the thickness and continuity of the portion of the cathode layer 23 on the side wall 341 of the first via hole 34. The second connection pattern(s) 41 are located in the source-drain metal layer 40, and the second connection pattern(s) 41 may be formed by an existing process for manufacturing the display substrate 110, so that a cost of manufacturing the second connection pattern(s) 41 may be reduced.

In some embodiments, referring to FIG. 1, the peripheral region 1102 is disposed around the display region 1101, and the peripheral region 1102 includes a first peripheral sub-region 1102A, a second peripheral sub-region 1102B, a third peripheral sub-region 1102C, and a fourth peripheral sub-region 1102D.

Referring to FIG. 1, the first peripheral sub-region 1102A and the second peripheral sub-region 1102B are located on two opposite sides of the display region 1101 in a second direction L2, and the third peripheral sub-region 1102C and the fourth peripheral sub-region 1102D are located on two opposite sides of the display region 1101 in a first direction L1. The first direction L1 is a row direction (the horizontal direction in FIG. 1) in which sub-pixels are arranged in the display region 1101, and the second direction L2 is a column direction (the vertical direction in FIG. 1) in which sub-pixels are arranged in the display region 1101.

The first peripheral sub-region 1102A is a region for realizing electrical connection with a circuit board 120. The first via hole(s) 31 are located in at least one of the second peripheral sub-region 1102B, the third sub-peripheral region 1102C, and the fourth peripheral sub-region 1102D. For example, the circuit board 120 includes an integrated circuit (IC) chip.

For example, referring to FIG. 1, the first peripheral sub-region 1102A is located at a lower side of the display region 1101; the second peripheral sub-region 1102B is located at an upper side of the display region 1101; the third peripheral sub-region 1102C is located at a left side of the display region 1101; and the fourth peripheral sub-region 1102D is located at a right side of the display region 1101.

For example, referring to FIG. 1, the display device 100 provided in the embodiments of the present disclosure further includes the circuit board 120, and chip-on-film(s) (COF(s)) 130 for connecting the circuit board 120 to the display substrate 110. The circuit board 120 is located at a side of the first peripheral sub-region 1102A away from the display region 1101, and is electrically connected to a portion of the cathode power line 31 located in the first peripheral sub-region 1102A through at least one COF 130 (four COFs 130 are shown in the drawing of the embodiment).

It will be noted that, the display substrate 110 further includes other signal lines located in the first peripheral sub-region 1102A, and the circuit board 120 is further electrically connected to the other signal lines. For example, the display substrate 110 further includes anode power line(s) VDD located in the first peripheral sub-region 1102A (as shown in FIG. 1). The anode power line VDD is electrically connected to the circuit board 120 and a source 14 of a thin film transistor TFT, and is used for providing an electrical signal to a drain of the thin film transistor TFT. The other signal lines included in the display substrate 110 will not be repeated here.

Figure 11:
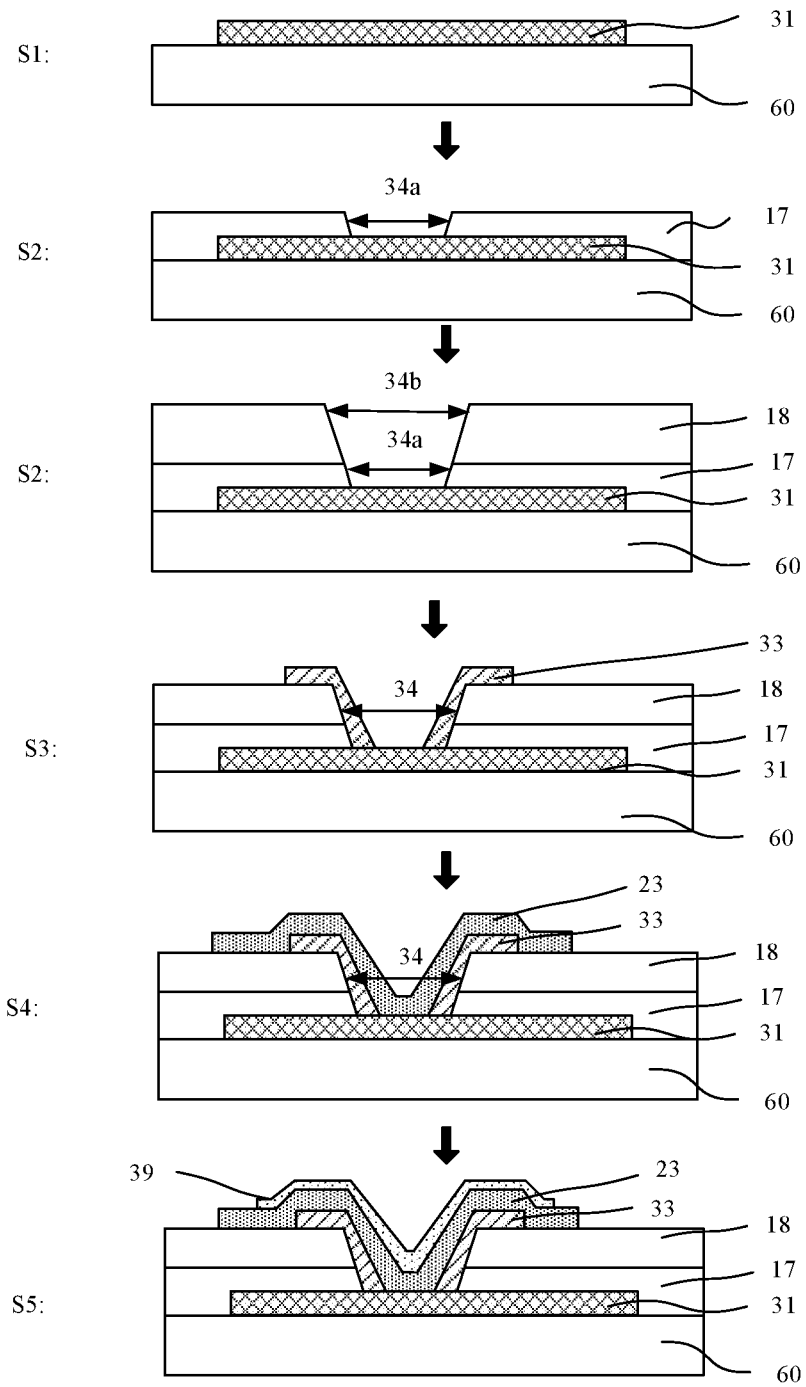
FIG. 11 is a flow diagram of a method for manufacturing a display substrate, in accordance with some embodiments.

Some embodiments of the present disclosure provide a method for manufacturing a display substrate, which is used for manufacturing the display substrate 110 described above. Referring to FIG. 11, the method for manufacturing the display substrate includes steps 1 to 4 (S1 to S4).

In S1, a substrate 60 is provided, and a cathode power line 31 is formed on the substrate 60.

The substrate 60 has a display region 1101 and a peripheral region 1102 surrounding the display region 1101. The cathode power line 31 is located on a surface of the substrate 60 and located in the peripheral region 1102. For example, "forming the cathode power line 31 on the substrate 60" includes forming a source-drain metal film on the surface of the substrate 60, and patterning the source-drain metal film to form the source-drain metal layer 40 including the cathode power line 31. Sources 14 and drains 15 of thin film transistors TFT, which are included in the source-drain metal layer 40, are formed simultaneously with the cathode power line 31.

It will be noted that, the substrate 60 includes the base 11 and other layers formed on the base 11. For example, in the case where the cathode power line 31 is located in the source-drain metal layer 40, the substrate 60 includes at least the base 11, and the semiconductor layer 20, the gate metal layer 30, the gate insulating layer 16 and the second insulating layer 17 that are disposed on the base 11. The substrate 60 may further include display driving circuits provided in the display region 1101, and other signal lines disposed in the peripheral region 1101.

In S2, an insulating film is formed on a side of a layer in which the cathode power line 31 is located away from the substrate 60, and the insulating film is patterned to form at least one first via hole 34 in the insulating film, so as to obtain the first insulating layer 32.

In a case where the first insulating layer 32 includes a passivation layer 18 and a planarization layer 19, the S2 includes: forming a passivation film on the side of the layer in which the cathode power line 31 is located away from the substrate 60, and patterning the passivation film to form the passivation layer 18 having first sub-via hole(s) 34a; and then forming a planarization film on a side of the passivation layer 18 away from the substrate 60, and patterning the planarization film to form the planarization layer 19 having second sub-via hole(s) 34b. An orthogonal projection of a first sub-via hole 34a on the substrate 60 is located within an orthogonal projection of a corresponding second sub-via hole 34b on the substrate 60.

In S3, the spacer(s) 33 are formed on the substrate 60 on which the first insulating layer 32 has been formed. A spacer 33 covers at least a side wall 341 of a first via hole 34. A thickness of a portion of the spacer 33 covering the side wall 341 of the first via hole 34 gradually decreases along the side wall 341 of the first via hole 34 and in a direction pointing from an end of the side wall 341 proximate to the substrate 60 toward an end of the side wall 341 away from the substrate 60.

Referring to FIGS. 5A to 5C, the spacer 33 includes a first portion 331. The first portion 331 covers the side wall 341 of the first via hole 34. The first portion 331 includes a first sub-spacer 331A and/or a second sub-spacer 331B, the first sub-spacer 331A is located in the anode layer 50, and the second sub-spacer 331B and the pixel defining layer 24 are disposed in the same layer. In a case where the first portion includes the first sub-spacer and the second sub-spacer, the first sub-spacer and the second sub-spacer are stacked.

In some embodiments, in the case where the spacer 33 includes at least the first sub-spacer 331A, the spacer 33 further includes a second portion 332. The second portion 332 is located in the anode layer 50, and the second portion 332 is electrically connected to the first sub-spacer 331A. The second portion 332 covers a portion of the cathode power line 31 exposed by the first via hole 34, and the second portion 332 is electrically connected to the cathode layer 23 to be formed.

In S4, the cathode layer 23 is formed on the substrate 60 on which the spacer(s) 33 have been formed. The cathode layer 23 covers the first via hole(s) 34, and the cathode layer 23 is electrically connected to the cathode power line 31 through the first via hole(s) 34.

In the method for manufacturing the display substrate provided in the embodiments of the present disclosure, the first portion 331 of the spacer 33 is formed on the side wall 341 of the first via hole 34, and the first portion 331 of the spacer 33 is able to reduce a slope angle of the side wall 341 of the first via hole 34. As a result, the climbing difficulty of the material of the cathode layer 23 in the first via hole 34 may be further reduced, a thickness of a portion of the cathode layer 23 covering the side wall 341 of the first via hole 34 may be increased, and the risk of the cathode layer 23 breaking at the first via hole 34 may be reduced.

In some embodiments, the method for manufacturing the display substrate further includes step 5 (S5).

In S5, referring to FIG. 8, the second auxiliary connection pattern(s) 39 are formed on a side of the cathode layer 23 away from the substrate 60. A second auxiliary connection pattern 39 covers at least a portion of the cathode layer 23 located in a first via hole 34, and is electrically connected to the cathode layer 23, so as to reduce the resistance of the cathode layer 23 at the first via hole 34.

It will be noted that, referring to FIG. 8, in a case where the pixel defining layer 24 has the third via hole(s) 36, S5 further includes forming the first auxiliary connection pattern(s) 38 on the side of the cathode layer away from the substrate 60. A first auxiliary connection pattern 38 covers at least a portion of the cathode layer 23 located in a third via hole 36, and is electrically connected to the cathode layer 23, so as to reduce the resistance of the cathode layer 23 at the third via hole 36.

The foregoing descriptions are merely specific implementations of the present disclosure, but the protection scope of the present disclosure is not limited thereto. Any person skilled in the art could conceive of changes or replacements within the technical scope of the present disclosure, which shall all be included in the protection scope of the present disclosure. Therefore, the protection scope of the present disclosure shall be subject to the protection scope of the claims.

What is claimed is:

1. A display substrate having a display region and a peripheral region surrounding the display region, comprising:
   a base;
   a cathode power line disposed on the base and located in the peripheral region;
   a first insulating layer located on a side of a layer in which the cathode power line is located away from the base, the first insulating layer having at least one first via hole, the first insulating layer including a passivation layer and a planarization layer that are stacked, the passivation layer being located on a side of the planarization layer proximate to the base, and the passivation layer is in contact with the planarization layer;
   a cathode layer located on a side of the first insulating layer away from the base, the cathode layer being electrically connected to the cathode power line through the at least one first via hole;
   at least one spacer located on a side of the cathode layer proximate to the base, a spacer covering at least a side wall of a first via hole, a thickness of a portion of the spacer covering the side wall of the first via hole gradually decreasing along the side wall of the first via hole and in a direction pointing from an end of the side wall of the first via hole proximate to the base toward an end of the side wall of the first via hole away from the base;
   an anode layer located between the first insulating layer and the cathode layer; and
   a pixel defining layer located between the anode layer and the cathode layer, wherein
   the spacer includes a first portion covering the side wall of the first via hole, wherein the first portion includes a first sub-spacer and/or a second sub-spacer; the first sub-spacer is included and located in the anode layer, and the second sub-spacer and the pixel defining layer are disposed in a same layer.

2. The display substrate according to claim 1, wherein the spacer includes at least the first sub-spacer; and
   the spacer further includes a second portion electrically connected to the first sub-spacer, wherein the second portion and the first sub-spacer are disposed in a same layer, the second portion covers a portion of the cathode power line exposed by the first via hole, and the second portion is electrically connected to the cathode layer.

3. The display substrate according to claim 2, wherein the first via hole includes a first sub-via hole that is disposed in the passivation layer and a second sub-via hole that is disposed in the planarization layer; and an orthogonal projection of the first sub-via hole on the base is located within an orthogonal projection of the second sub-via hole on the base.

4. The display substrate according to claim 3, wherein a contour of an end of the first via hole proximate to the planarization layer coincides with a contour of an end of a second via hole proximate to the passivation layer.

5. The display substrate according to claim 3, wherein an orthogonal projection, on the base, of an end of the first via hole proximate to the planarization layer is located within an orthogonal projection, on the base, of an end of a second via hole proximate to the passivation layer.

6. The display substrate according to claim 3, wherein the first insulating layer further has at least one second via hole, and the at least one second via hole penetrates at least the passivation layer in the first insulating layer; the pixel defining layer has at least one third via hole; and
the display substrate further comprises at least one first connection pattern included and located in the anode layer, wherein the at least one first connection pattern is electrically connected to the cathode power line through the at least one second via hole, and the at least one first connection pattern is further electrically connected to the cathode layer through the at least one third via hole.

7. The display substrate according to claim 6, wherein at least one region of the planarization layer corresponding to the at least one first connection pattern is hollowed out, and a first connection pattern is embedded in a corresponding hollowed-out portion of the at least one region of the planarization layer.

8. The display substrate according to claim 6, wherein the at least one second via hole further penetrates the planarization layer in the first insulating layer;
a first connection pattern includes a first connection sub-pattern and a second connection sub-pattern that are electrically connected to each other, wherein
the first connection sub-pattern covers at least a side wall of a corresponding second via hole; a thickness of a portion of the first connection sub-pattern covering the side wall of the second via hole gradually decreases along the side wall of the second via hole and in a direction pointing from an end of the side wall of the second via hole proximate to the base toward an end of the side wall of the second via hole away from the base; the first connection sub-pattern is electrically connected to the cathode power line; and
an orthogonal projection of the second connection sub-pattern on the base is at least partially overlapped with an orthogonal projection of a corresponding third via hole on the base, and the second connection sub-pattern is electrically connected to the cathode layer.

9. The display substrate according to claim 6, wherein orthogonal projections of a second via hole and a third via hole that correspond to a same first connection pattern on the base are staggered.

10. The display substrate according to claim 6, further comprising at least one first auxiliary connection pattern located on a side of the cathode layer away from the base, a first auxiliary connection pattern of the at least one first auxiliary connection pattern covering at least a portion of the cathode layer located in a third via hole and being electrically connected to the cathode layer; or
the display substrate further comprising at least one first auxiliary connection pattern located on a side of the cathode layer away from the base, a first auxiliary connection pattern of the at least one first auxiliary connection pattern covering at least a portion of the cathode layer located in a third via hole and being electrically connected to the cathode layer, wherein
the first auxiliary connection pattern of the at least one first auxiliary connection pattern is capable of transmitting light.

11. The display substrate according to claim 1, wherein the spacer further includes a third portion located on a surface of the first insulating layer away from the base and disposed around the first via hole, wherein
the first portion includes the first sub-spacer, the third portion includes a first edge pattern, and the first edge pattern and the first sub-spacer are disposed in a same layer and connected to each other; and/or
the first portion includes the second sub-spacer, the third portion includes a second edge pattern, and the second edge pattern and the second sub-spacer are disposed in a same layer and connected to each other.

12. The display substrate according to claim 11, wherein the third portion includes both the first edge pattern and the second edge pattern, and the first edge pattern and the second edge pattern are stacked.

13. The display substrate according to claim 1, further comprising at least one second auxiliary connection pattern located on a side of the cathode layer away from the base, a second auxiliary connection pattern of the at least one second auxiliary connection pattern covering at least a portion of the cathode layer located in the first via hole and being electrically connected to the cathode layer.

14. The display substrate according to claim 13, wherein the second auxiliary connection pattern of the at least one second auxiliary connection pattern is capable of transmitting light.

15. The display substrate according to claim 1, further comprising:
a gate metal layer disposed between the base and the first insulating layer;
a source-drain metal layer disposed between the gate metal layer and the first insulating layer; and
a second insulating layer disposed between the gate metal layer and the source-drain metal layer, wherein
the cathode power line is included and located in the gate metal layer, or, the cathode power line is included and located in the source-drain metal layer.

16. The display substrate according to claim 15, wherein the cathode power line is included and located in the gate metal layer; and
the display substrate further comprises at least one second connection pattern located in the source-drain metal layer, wherein
the cathode layer is electrically connected to the at least one second connection pattern through the at least one first via hole; and
the second insulating layer has at least one fourth via hole, and the at least one second connection pattern is electrically connected to the cathode power line through the at least one fourth via hole.

17. The display substrate according to claim 1, wherein the peripheral region includes a first peripheral sub-region, a second peripheral sub-region, a third peripheral sub-region, and a fourth peripheral sub-region;
- the first peripheral sub-region and the second peripheral sub-region are located on two opposite sides of the display region along a second direction, and the third peripheral sub-region and the fourth peripheral sub-region are located on two opposite sides of the display region along a first direction; the first direction is a row direction in which sub-pixels are arranged in the display region, and the second direction is a column direction in which sub-pixels are arranged in the display region;
- the first peripheral sub-region is a region for realizing electrical connection with a circuit board; and
- the at least one first via hole is located in at least one of the third peripheral sub-region, the second peripheral sub-region, and the fourth peripheral sub-region.

18. A display device, comprising the display substrate according to claim 1.

19. The display substrate according to claim 1, wherein the first portion includes both the first sub-spacer and the second sub-spacer, and the first sub-spacer and the second sub-spacer are stacked.

\* \* \* \* \*